US010529667B1

(12) United States Patent
Chen et al.

(10) Patent No.: US 10,529,667 B1
(45) Date of Patent: Jan. 7, 2020

(54) METHOD OF FORMING OVERLAY MARK STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Zheng-Feng Chen, New Taipei (TW); Sho-Shen Lee, New Taipei (TW); En-Chiuan Liou, Tainan (TW); Hsiao-Lin Hsu, Yunlin County (TW); Yi-Ting Chen, Tainan (TW); Lu-Wei Kuo, Yilan County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/049,826

(22) Filed: Jul. 31, 2018

(30) Foreign Application Priority Data

Jul. 5, 2018 (CN) .......................... 2018 1 0728816

(51) Int. Cl.

| | |
|---|---|
| ***H01L 23/544*** | (2006.01) |
| ***H01L 27/108*** | (2006.01) |
| ***H01L 21/027*** | (2006.01) |
| ***H01L 21/3213*** | (2006.01) |
| ***H01L 21/311*** | (2006.01) |

(52) U.S. Cl.

CPC ........ *H01L 23/544* (2013.01); *H01L 21/0276* (2013.01); *H01L 21/31144* (2013.01); *H01L 21/32139* (2013.01); *H01L 27/10855* (2013.01); *H01L 27/10808* (2013.01); *H01L 27/10823* (2013.01); *H01L 2223/54426* (2013.01)

(58) Field of Classification Search

None

See application file for complete search history.

(56) References Cited

U.S. PATENT DOCUMENTS

| | | | | |
|---|---|---|---|---|
| 2007/0063317 | A1 | 3/2007 | Kim | |
| 2010/0052191 | A1* | 3/2010 | Trogisch | G03F 9/708 257/797 |
| 2011/0285036 | A1* | 11/2011 | Yao | G03F 7/70633 257/797 |
| 2012/0038021 | A1* | 2/2012 | Chen | G03F 7/70633 257/506 |

* cited by examiner

*Primary Examiner* — Thien F Tran

(74) *Attorney, Agent, or Firm* — Winston Hsu

(57) ABSTRACT

A method of forming an overlay mark structure includes the following steps. An insulation layer is formed on a substrate. A first overlay mark is formed in the insulation layer. A metal layer is formed on the substrate. The metal layer covers the insulation layer and the first overlay mark. The metal layer on the first overlay mark is removed. A top surface of the first overlay mark is lower than a top surface of the insulation layer after the step of removing the metal layer on the first overlay mark. A second overlay mark is formed on the metal layer. In the method of forming the overlay mark structure, the first overlay mark may not be covered by the metal layer for avoiding influences on related measurements, and the second overlay mark may be formed on the metal layer for avoiding related defects generated by the height difference.

14 Claims, 8 Drawing Sheets

METHOD OF FORMING OVERLAY MARK STRUCTURE

BACKGROUND OF THE INVENTION

1. Field of the Invention

The present invention relates to a method of forming an overlay mark structure, and more particularly, to a method of forming an overlay mark structure including two overlay marks.

2. Description of the Prior Art

The manufacture of integrated circuits keeps improving as the related technologies progress. Many kinds of electric circuits may be integrated and formed on a single chip. The semiconductor process for manufacturing chips may include many steps, such as a deposition process for forming a thin film, a photoresist coating process, an exposure process, and a develop process for forming a patterned photoresist, and an etching process for patterning the thin film. In the exposure process, a photomask having a pattern to be formed has to be aligned with a base layer pattern on a wafer for transferring the pattern to a specific location on the wafer. The alignment condition may be monitored by measuring the relative position between overlay marks of different layers for reducing the influence of process variations on the production yield. However, as the semiconductor process becomes complicated, the overlay masks of different layers may influence each other during the processes, and problems about the manufacturing and the measurements of the overlay marks are generated accordingly and have to be solved.

SUMMARY OF THE INVENTION

A method of forming an overlay mark structure is provided in the present invention. Apart of a metal layer is removed while another part of the metal layer remains for avoiding influences of the metal layer covering an overlay mark on related measurements, and another overlay mark may be formed on the metal layer for avoiding related defects generated by the height difference.

According to an embodiment of the present invention, a method of forming an overlay mark structure is provided. The method includes the following steps. Firstly, an insulation layer is formed on a substrate. A first overlay mark is formed in the insulation layer. A metal layer is formed on the substrate, and the metal layer covers the insulation layer and the first overlay mark. The metal layer on the first overlay mark is removed, and a top surface of the first overlay mark is lower than a top surface of the insulation layer after the step of removing the metal layer on the first overlay mark. A second overlay mark is formed on the metal layer.

In the method of forming the overlay mark structure according to the present invention, the metal layer is partially removed only. Therefore, the first overlay mark may not be covered by the metal layer, and the second overlay mark may be formed on the remaining metal layer. The influence of the metal layer covering the first overlay mark on the related measurements may be avoided by removing the metal layer on the first overlay mark. In addition, related defects generated by the height difference cause by the metal layer may be avoided by forming the second overlay mark on the metal layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-9 are schematic drawings illustrating a method of forming an overlay mark structure according to a first embodiment of the present invention, wherein FIG. 2 is a cross-sectional diagram taken along a line A-A' in FIG. 1, FIG. 3 is a schematic drawing in a step subsequent to FIG. 1, FIG. 4 is a cross-sectional diagram taken along a line B-B' in FIG. 3, FIG. 5 is a schematic drawing in a step subsequent to FIG. 3, FIG. 6 is a cross-sectional diagram taken along a line C-C' in FIG. 5, FIG. 7 is a schematic drawing in a step subsequent to FIG. 5, FIG. 8 is a cross-sectional diagram taken along a line D-D' in FIG. 7, and FIG. 9 is a schematic drawing in a step subsequent to FIG. 8.

FIGS. 10-13 are schematic drawings illustrating a method of forming an overlay mark structure according to a second embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

DETAILED DESCRIPTION

Figure 1:
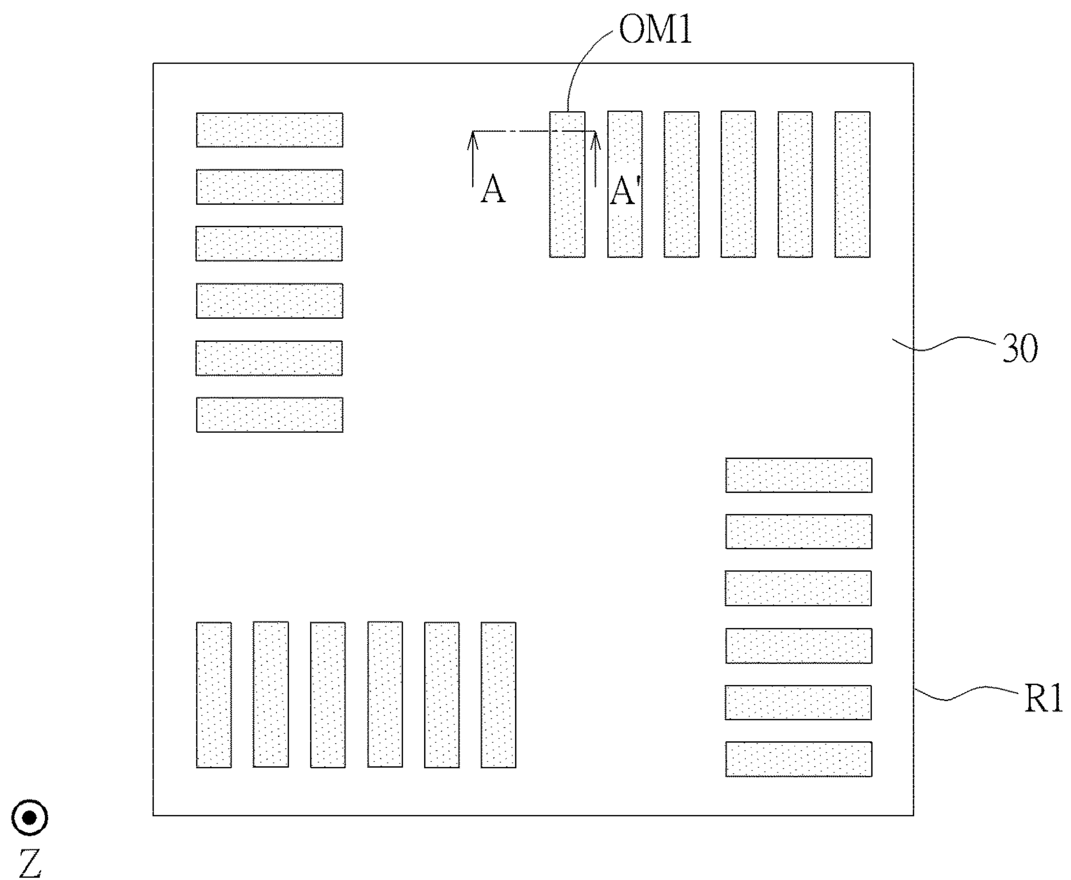
Figure 2:
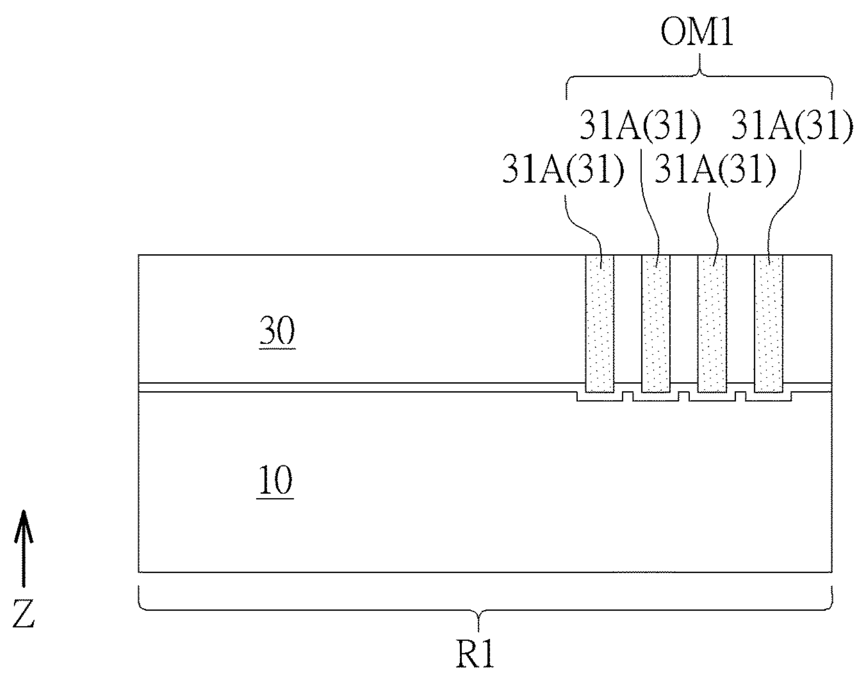
Figure 3:
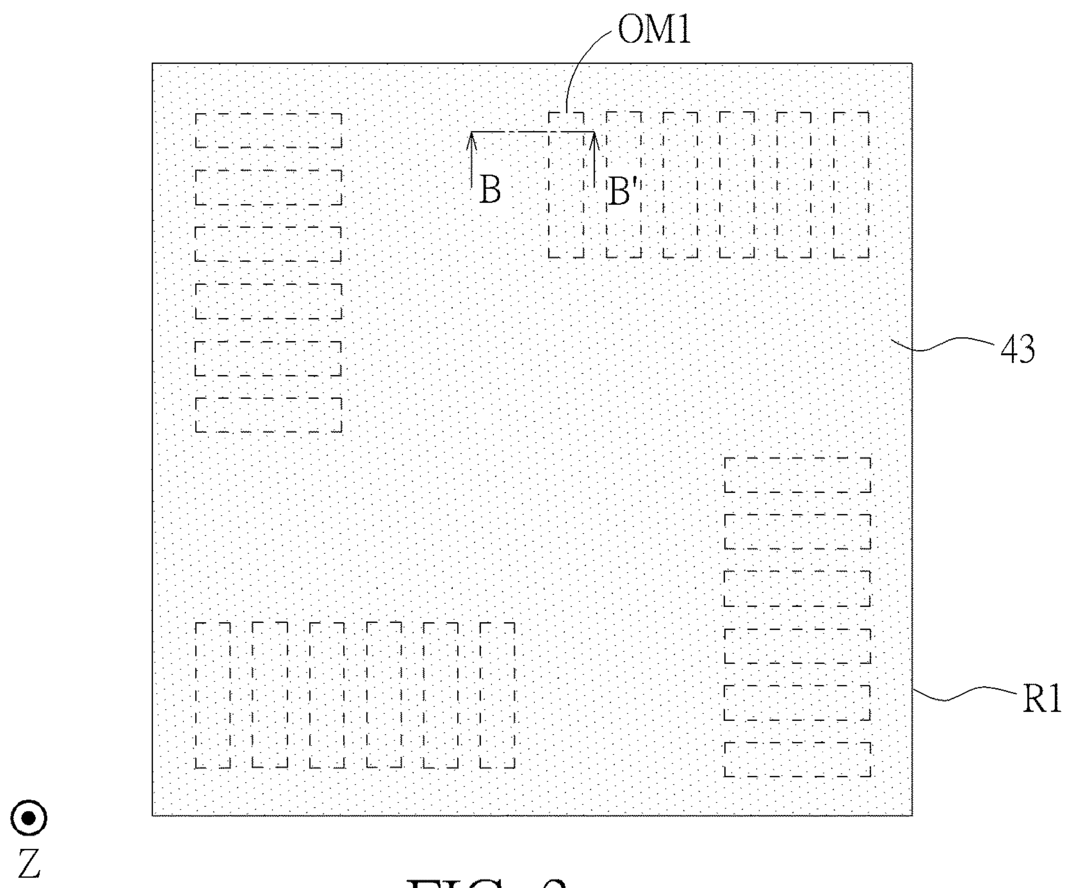
Figure 4:
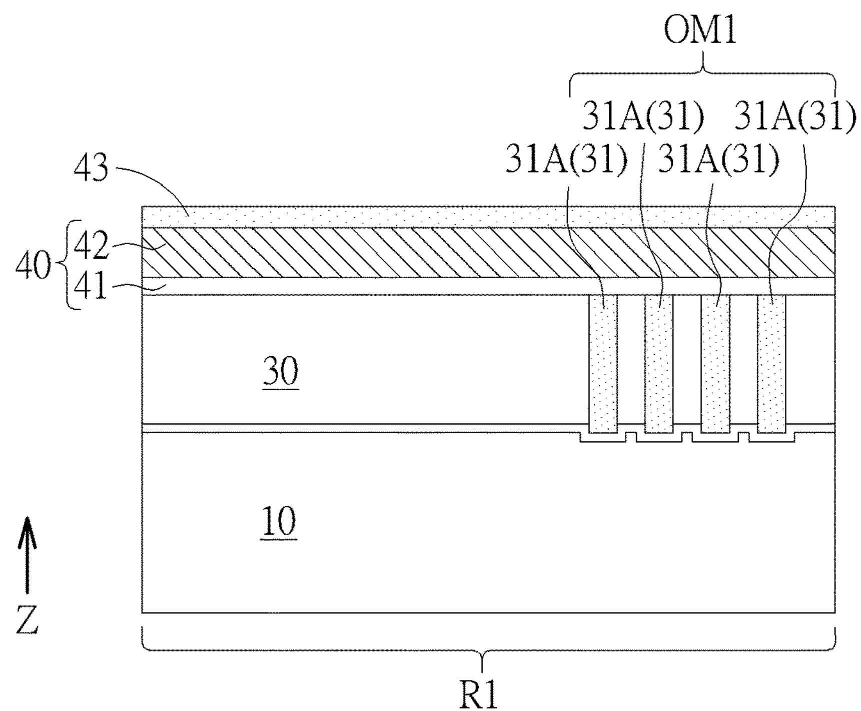
Figure 5:
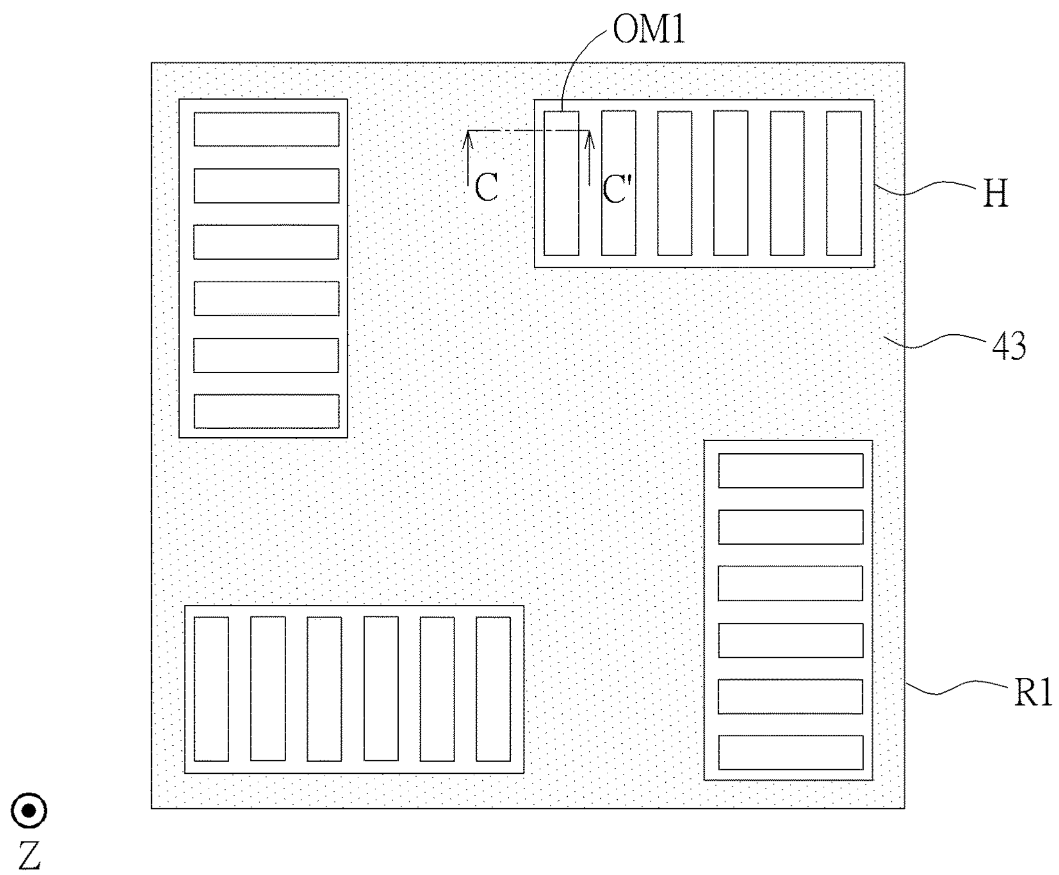
Figure 6:
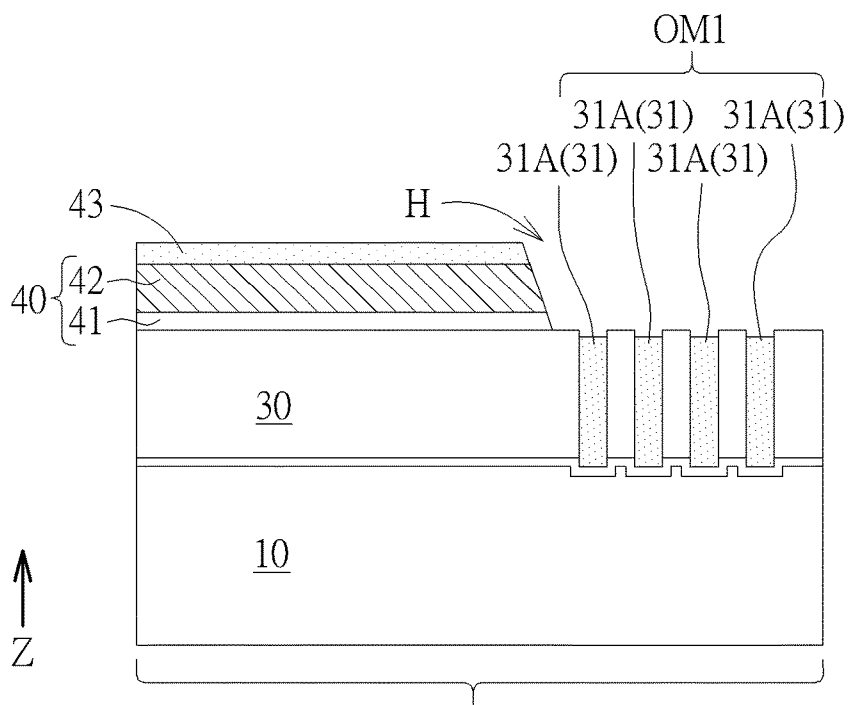
Figure 7:
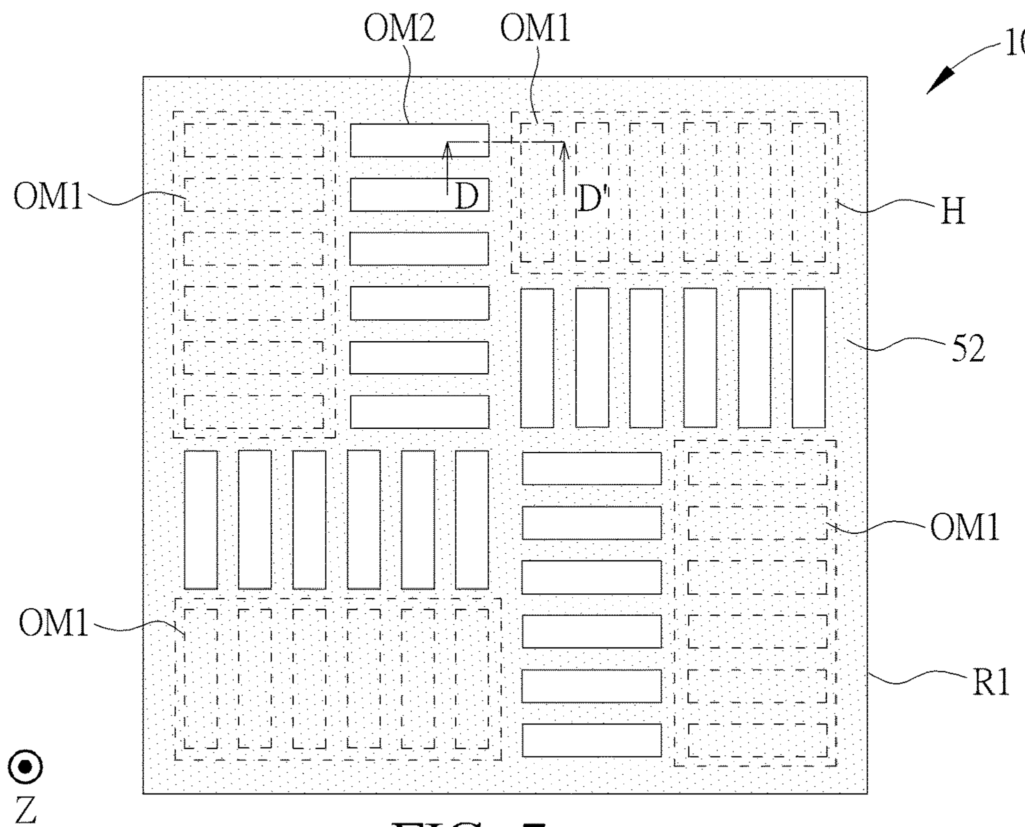
Figure 8:
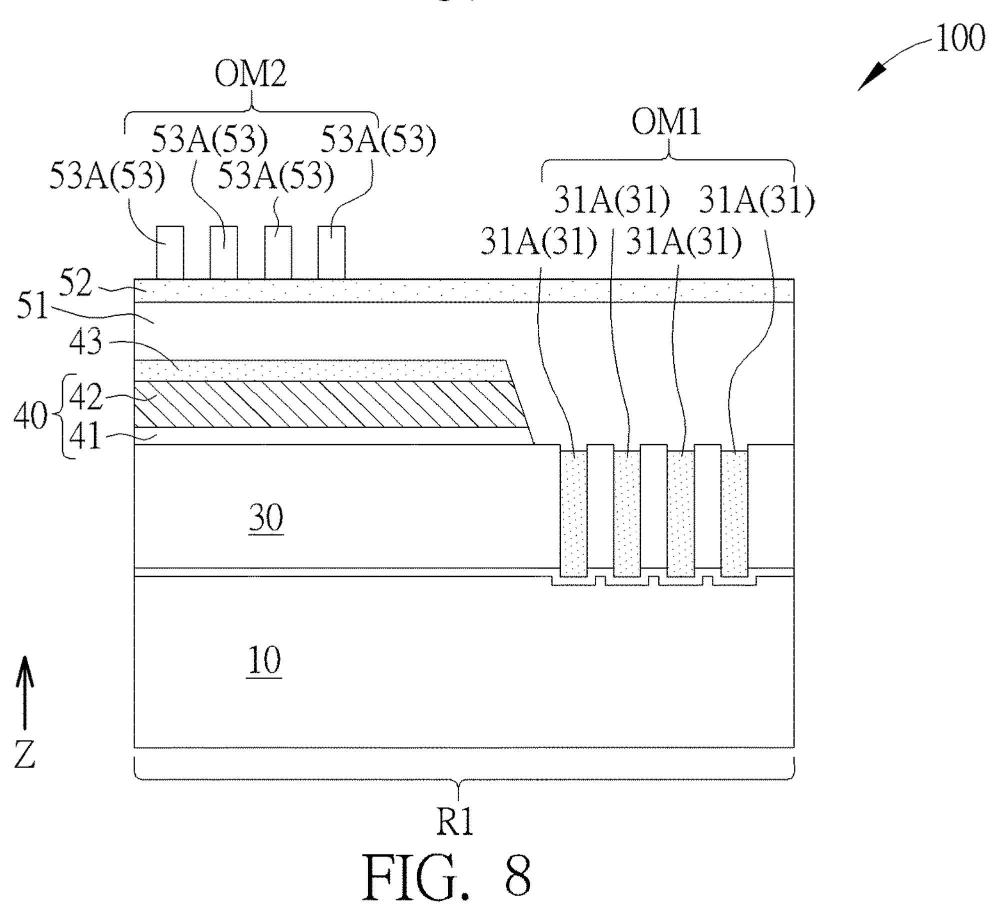

Please refer to FIGS. 1-8. FIGS. 1-8 are schematic drawings illustrating a method of forming an overlay mark structure according to a first embodiment of the present invention, wherein FIG. 1, FIG. 3, FIG. 5 and FIG. 7 are top-view diagrams, and FIG. 2, FIG. 4, FIG. 6, and FIG. 8 are cross-sectional diagrams. FIG. 3 is a schematic drawing in a step subsequent to FIG. 1, FIG. 5 is a schematic drawing in a step subsequent to FIG. 3, and FIG. 7 is a schematic drawing in a step subsequent to FIG. 5. FIG. 2 is a cross-sectional diagram taken along a line A-A' in FIG. 1, FIG. 4 is a cross-sectional diagram taken along a line B-B' in FIG. 3, FIG. 6 is a cross-sectional diagram taken along a line C-C' in FIG. 5, and FIG. 8 is a cross-sectional diagram taken along a line D-D' in FIG. 7. The method of forming the overlay mark structure in this embodiment may include the following steps. As shown in FIG. 1 and FIG. 2, an insulation layer 30 is formed on a substrate 10, and a first overlay mark OM1 is formed in the insulation layer 30. In some embodiments, the substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed by other suitable semiconductor materials. The none-semiconductor substrate mentioned above may include a glass substrate, a ceramic substrate, a plastic substrate, or substrates formed by other suitable non-semiconductor materials. The insulation layer 30 may include oxide, nitride, or other suitable insulation materials.

In some embodiments, the first overlay mark OM1 may include an insulation material 31, and the material composition of the insulation material 31 may be different from the material composition of the insulation layer 30. For example, when the insulation layer 30 is oxide, the insulation material 31 may include a material having an etching selectivity to the insulation layer 30, such as silicon nitride or silicon carbonitride (SiCN), but not limited thereto. In some embodiments, the first overlay mark OM1 may be formed by a conductive material according to some considerations. Additionally, the first overlay mark OM1 may include a plurality of first sections 31A buried in the insulation layer 30, and the method of forming the first sections 31A may include forming a plurality of trenches in the insulation layer 30 by an etching approach, forming the insulation material 31 on the insulation layer 30 and filling the trenches with the insulation material 31, and then performing a planarization process and/or an etching back process for removing the insulation material 31 outside the trenches and forming the first sections 31A in the insulation layer 30. Therefore, the first sections 31A may be formed by the insulation material 31, and the top surface of the insulation layer 30 and the top surface of the first overlay mark OM1 and the first sections 31A may be coplanar, but not limited thereto. Additionally, in some embodiments, other insulation layers, such as a native oxide layer and/or a silicon carbonitride layer, may be located between the insulation layer 30 and the substrate 10 and located between the first overlay mark OM1 and the substrate 10, but not limited thereto. In this embodiment, a main region (not shown in FIG. 1 and FIG. 2) and an overlay mark region R1 may be defined on the substrate 10, and the first overlay mark OM1 may be formed on the overlay mark region R1. In some embodiments, the main region mentioned above may include a region for forming the main integrated circuits and/or semiconductor devices, and the overlay mark region R1 may be a peripheral region, such as a scribe line region, outside the main region, but not limited thereto.

Subsequently, as shown in FIG. 3 and FIG. 4, a metal layer 40 is formed on the substrate 10, and the metal layer 40 may cover the insulation layer 30 and the first overlay mark OM1 in a thickness direction Z of the substrate 10. In some embodiments, the metal layer 40 may include a barrier layer 41 and a low resistivity material layer 42. The barrier layer 41 may include titanium (Ti), titanium nitride (TiN), tantalum (Ta), tantalum nitride (TaN), tungsten silicide (WSi), tungsten nitride (WN), or other suitable barrier materials. The low resistivity material layer 42 may include aluminum (Al), tungsten (W), copper (Cu), titanium aluminide (TiAl), or other suitable low resistivity materials. Additionally, a cap layer 43 may be formed on the metal layer 40 according to some considerations, and a part of the cap layer 43 may overlap the first overlay mark OM1 in the thickness direction Z of the substrate 10, but not limited thereto. The cap layer 43 may include insulation materials, such as silicon nitride and/or silicon carbonitride, but not limited thereto.

Subsequently, as shown in FIGS. 3-6, the metal layer 40 and the cap layer 43 on the first overlay mark OM1 are removed for exposing the first overlay mark OM1. In some embodiments, the cap layer 43 and the metal layer 40 may be etched for forming a plurality of openings H at the part of the metal layer 40 located corresponding to the first overlay mark OM1 and the part of the cap layer 43 located corresponding to the first overlay mark OM1, and the openings H are formed corresponding to and expose the first overlay mark OM1. In other words, the cap layer 43 may be formed on the metal layer 40 before the step of removing the metal layer 40 on the first overlay mark OM1. The metal layer 40 and the cap layer 43 on the overlay mark region R1 may be partially removed only, and the cap layer 43 and the metal layer 40 may still cover a part of the insulation layer on the overlay mark region R1. It is worth noting that, a part of the first overlay mark OM1 will be removed by the etching process of forming the openings H and the top surface of the first overlay mark OM1 is lower than the top surface of the insulation layer 30 in the thickness direction Z of the substrate 10 after the step of removing the metal layer 40 on the first overlay mark OM1 because the material of the first overlay mark OM1 is different from the material of the insulation layer 30 and the etching process of forming the openings H in the metal layer 40 and the cap layer 43 has a relatively lower etching rate to the insulation layer 30 preferably. In some embodiments, the step of removing the metal layer 40 and the cap layer 43 on the first overlay mark OM1 may be performed with other photolithography processes required in the original manufacturing process. For example, the step of removing the metal layer 40 and the cap layer 43 on the first overlay mark OM1 and a process of forming a vernier structure may be performed concurrently for avoiding complicating the manufacturing process and increasing the manufacturing cost, but not limited thereto.

As shown in FIG. 7 and FIG. 8, a second overlay mark OM2 is formed on the metal layer 40 and the cap layer 43, and a part of the cap layer 43 may be located between the second overlay mark OM2 and the metal layer 40 in the thickness direction Z of the substrate 10. The cap layer 43 and the metal layer 40 on the first overlay mark OM1 may be removed before the step of forming the second overlay mark OM2, but not limited thereto. In some embodiments, the cap layer 43 and the metal layer 40 on the first overlay mark OM1 may be removed after the step of forming the second overlay mark OM2 according to some considerations. The first overlay mark OM1 and the second overlay mark OM2 may be overlay marks formed corresponding to different processes performed on the main region described above. For example, the first overlay mark OM1 may be corresponding to a photolithography process of forming a patterned isolation structure in the insulation layer 30 on the main region, and the second overlay mark OM2 may be corresponding to a photolithography process of patterning the metal layer 40 on the main region, but not limited thereto. Therefore, in some embodiments, the second overlay mark OM2 may include a photoresist material 53, but not limited thereto. In some embodiments, the second overlay mark OM1 may also be formed by other mask materials capable of being applied to pattern the metal layer 40. Additionally, the second overlay mark OM2 may include a plurality of second sections 53A, and each of the second sections 53A may be formed by the photoresist material 53 processed by an exposure process and a develop process, but not limited thereto In some embodiments, an organic dielectric layer 51 and an anti-reflection layer 52 may be formed covering the metal layer 40, the cap layer 43, the first overlay mark OM1 and the insulation layer 30 after the step of removing the metal layer 40 on the first overlay mark OM1 and before the step of forming the second overlay mark OM2, and the second overlay mark OM2 may be formed on the anti-reflection layer 52, but not limited thereto. The organic dielectric layer 51 may include an organic distribution layer (ODL) or other suitable organic dielectric materials, and the anti-reflection layer 52 may include a silicon-containing hard mask bottom anti-reflecting coating (SHB) or other suitable anti-reflection materials. As shown in FIG. 7 and FIG. 8, an overlay mark structure 100 including the first overlay mark OM1 and the second overlay mark OM2 may be formed by the manufacturing method described above. The first overlay mark OM1 and the second overlay mark OM2 may be formed on the overlay mark region R1, a projection pattern of the first overlay mark OM1 in the thickness direction Z of the substrate 10 (such as the part marked with OM1 in FIG. 7) surrounds at least a part of a projection pattern of the second overlay mark OM2 in the thickness direction Z of the substrate 10 (such as the part marked with OM2 in FIG. 7), and the first overlay mark OM1 does not overlap the second overlay mark OM2 in the thickness direction Z of the substrate 10, but not limited thereto. In some embodiments, the first overlay mark OM1 and the second overlay mark OM2 may have top-view patterns different from the patterns shown in FIG. 7.

The alignment condition of the exposure process for forming the second overlay mark OM2 may be confirmed by measuring the relative positions of the first overlay mark OM1 and the second overlay mark OM2 with an optical measurement from top view, and the influence on the yield of the final product may be avoided by reworking when the alignment variation is out of specification. Therefore, by the manufacturing method of the present invention, the metal layer 40 on the first overlay mark OM1 may be removed for avoiding the influence of the metal layer 40 on the optical measurements performed to the first overlay mark OM1. In addition, when the second overlay mark OM2 is formed by a photoresist material and the metal layer 40 on the overlay mark region R1 is removed completely, the photoresist material on the metal layer 40 above the main region will be higher than the photoresist material on the overlay mark region R1, a defocus issue may occur to the photoresist material on the overlay mark region R1 during the exposure process, and the second overlay mark OM2 cannot be formed successfully. Therefore, by the manufacturing method of the present invention, the second overlay mark OM2 may be formed on the metal layer 40 remaining on the overlay mark region R1, and related defects generated by the height difference cause by the metal layer 40 may be avoided accordingly.

Figure 9:
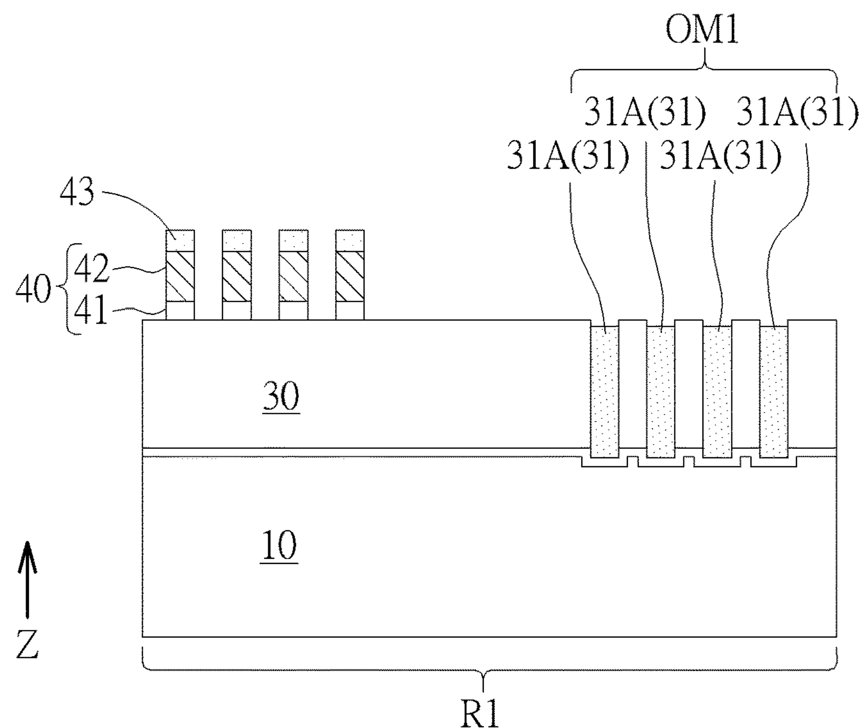

Please refer to FIG. 8 and FIG. 9. As shown in FIG. 8 and FIG. 9, in some embodiments, a patterning process with the second overlay mark OM2 as a mask may be performed to the cap layer 43 and the metal layer 40 for forming the patterned metal layer 40 and the patterned cap layer 43 on the insulation layer 30, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
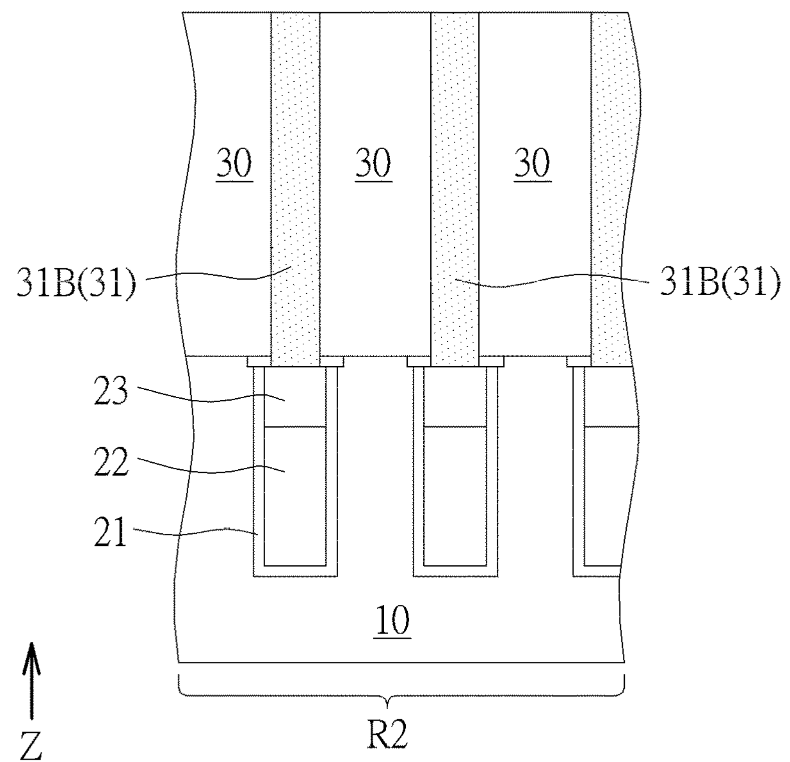
Figure 11:
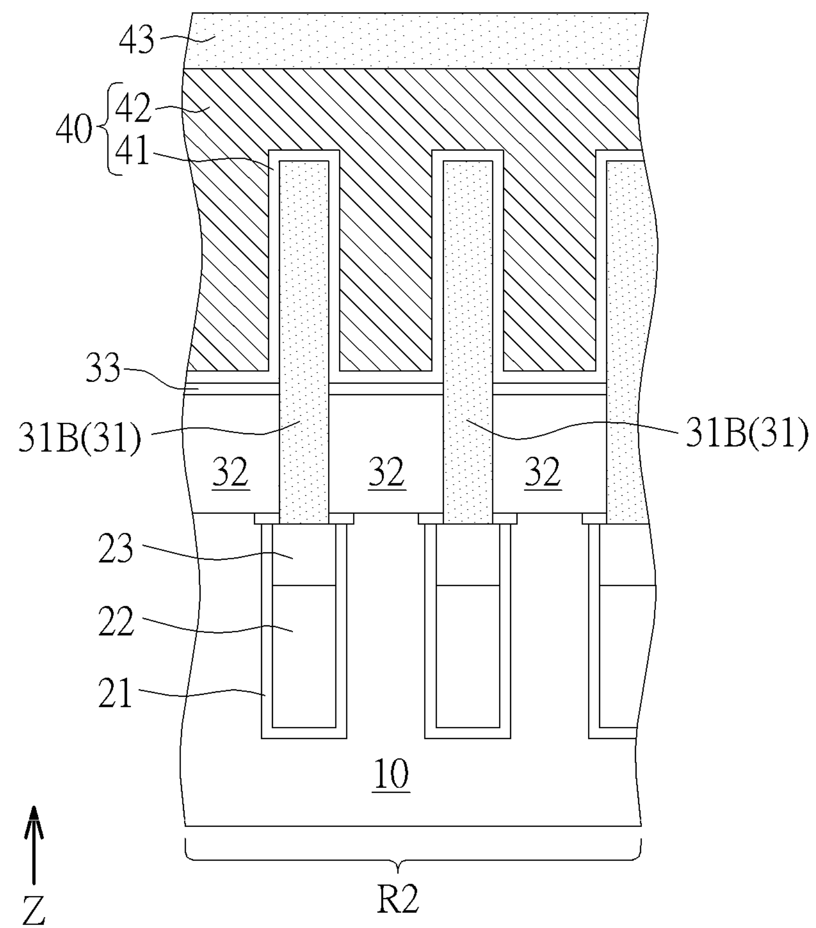
Figure 12:
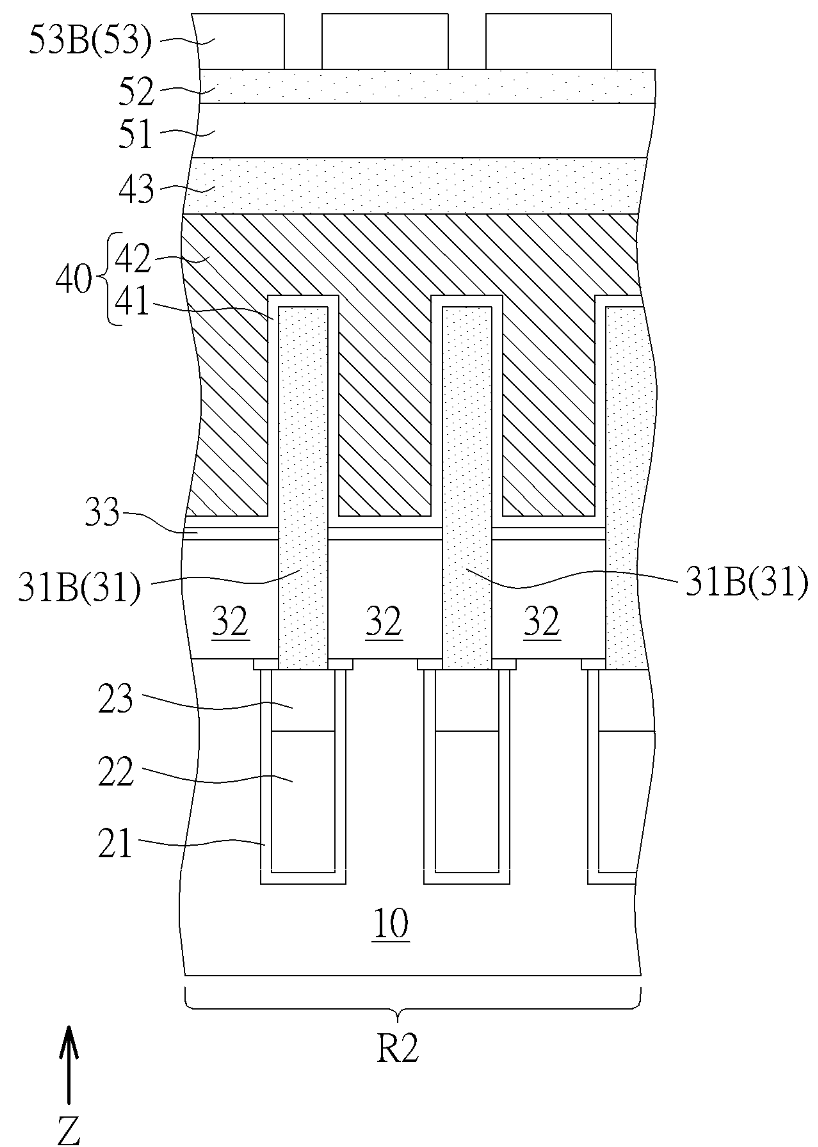
Figure 13:
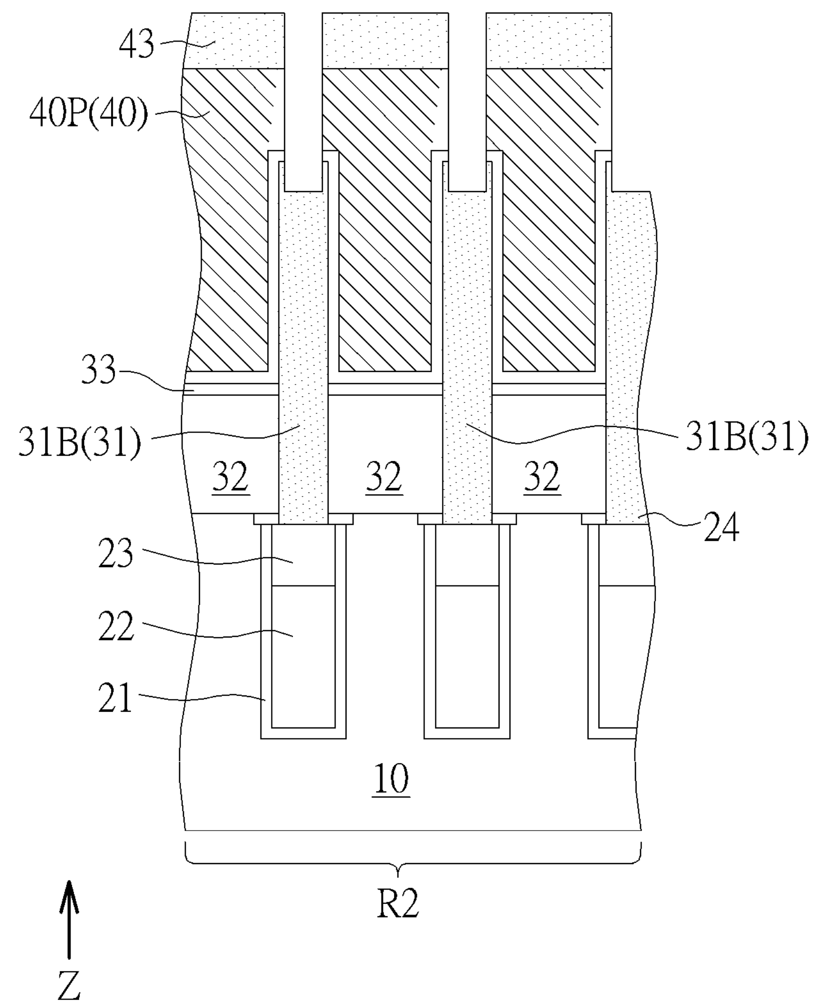

Please refer to FIGS. 10-13, FIG. 2, FIG. 6, FIG. 8, and FIG. 9. FIGS. 10-13 are schematic drawings illustrating a method of forming an overlay mark structure according to a second embodiment of the present invention. FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12. In addition, FIG. 10 may be regarded as a schematic drawing of the manufacturing condition the main region corresponding to the manufacturing condition of FIG. 2, FIG. 11 may be regarded as a schematic drawing of the manufacturing condition the main region corresponding to the manufacturing condition of FIG. 6, FIG. 12 may be regarded as a schematic drawing of the manufacturing condition the main region corresponding to the manufacturing condition of FIG. 8, and FIG. 13 may be regarded as a schematic drawing of the manufacturing condition the main region corresponding to the manufacturing condition of FIG. 9. In other words, FIG. 2 and FIG. 10 may be cross-sectional diagrams of the overlay mark region and the main region respectively under the same manufacturing condition, FIG. 6 and FIG. 11 may be cross-sectional diagrams of the overlay mark region and the main region respectively under the same manufacturing condition, FIG. 8 and FIG. 12 may be cross-sectional diagrams of the overlay mark region and the main region respectively under the same manufacturing condition, and FIG. 9 and FIG. 13 may be cross-sectional diagrams of the overlay mark region and the main region respectively under the same manufacturing condition.

As shown in FIG. 2 and FIG. 10, a min region R2 and the overlay mark region R1 may be defined on the substrate 10. In some embodiments, the main region R2 may include a memory cell region of a semiconductor memory device, but no limited thereto. Therefore, a plurality of word lines 22 may be formed in the main region R2 of the substrate 10, and the word lines 22 in this embodiment may be buried word lines, but not limited thereto. The word lines 22 may be buried in the substrate 10, a word line dielectric layer 21 may be formed between the word line 22 and the substrate 10, and a word line cap layer 23 may be formed on the word line 22 and cover the word line 22. The word line dielectric layer 21, the word line 22, and the word line cap layer 23 may be formed by forming trenches in the semiconductor substrate 10, and the word line dielectric layer 21, the word line 22, and the word line cap layer 23 may be sequentially formed in the trenches, but not limited thereto. In some embodiments, the other types of word line structures may also be applied according to other considerations. Additionally, the word line dielectric layer 21 may include silicon oxide or other suitable dielectric materials, the word line 22 may include aluminum, tungsten, copper, titanium aluminide, or other suitable conductive materials, and the word line cap layer 23 may include silicon nitride, silicon oxynitride, silicon carbonitride, or other suitable insulation materials. Additionally, in this embodiment, the insulation layer 30 may be further formed on the main region R2, and the insulation layer 30 may cover the substrate 10, the word line dielectric layer 21, the word line 22, and the word line cap layer 23 formed in the substrate 10.

The method in this embodiment may further include forming a plurality of isolation structures 31B on the main region R2, and the isolation structures 31B may be formed in the insulation layer 30 on the main region R2. In some embodiments, the first overlay mark OM1 located on the overlay mark region R1 and the isolation structures 31B located on the main region R2 may be formed concurrently by the same process, but not limited thereto. The method of forming the isolation structures 31B may include forming a plurality of trenches in the insulation layer 30 on the main region R2 by etching, forming the insulation material 31 on the insulation layer 30 and filling the trenches with the insulation material 31, and then performing a planarization process and/or an etching back process for removing the insulation material 31 outside the trenches and forming the isolation structures 31B in the insulation layer 30. In other words, the first overlay mark OM1 and the isolation structure 31B may be formed concurrently by the same material and the same process, and the material composition of the first overlay mark OM1 may be identical to the material composition of the isolation structures 31B accordingly.

As shown in FIG. 10 and FIG. 11, the insulation layer 30 on the main region R2 may be removed and a storage node contact structure 32 may be formed between two of the isolation structures 31B adjacent to each other. The storage node contact structure 32 may be formed corresponding to an active area in the substrate 10 and electrically connected with the corresponding active area. The storage node contact structure 32 may be formed by filling the space between the isolation structures 31B with a conductive material after the step of removing the insulation layer 30 and performing an etching back process to the conductive material. Therefore, the topmost surface of the storage node contact structure 32 may be lower than the topmost surface of the isolation structures 31B in the thickness direction Z of the substrate 10, and the topmost surface of the storage node contact structure 32 may be higher than the topmost surface of the substrate 10, but not limited thereto. The storage node contact structure 32 may include silicon, such as amorphous silicon, polysilicon, or other conductive materials containing silicon. However, in some embodiments, the storage node contact structure 32 may also be formed by other manufacturing processes and/or other materials according to some considerations. In addition, a metal silicide layer 33 may be formed on the surface of each storage node contact structure 32 for lowering the contact resistance between each storage node contact structure 32 and a conductive structure subsequently formed on the storage node contact structure 32.

As shown in FIG. 6 and FIG. 11, the metal layer 40 and the cap layer 43 may be further formed on the storage node contact structure 32, and the spacer between the adjacent isolation structure 31B may be filled with the metal layer 40 because the topmost surface of the storage node contact structure 32 is lower than the topmost surface of the isolation structures 31B. In addition, when forming the openings H corresponding to the first overlay mark OM1 in the metal layer 40 and the cap layer 43 above the overlay mark region R1, the metal layer 40 and the cap layer 43 on the main region R2 may be covered by a mask (not shown) for avoiding being damaged by the etching process.

As shown in FIG. 8 and FIG. 12, a patterned mask layer 53B may be formed on the metal layer 40 on the main region R2, and the organic dielectric layer 51 and the anti-reflection layer 52 may be further formed on the main region R2 and being located between the patterned mask layer 53B and the metal layer 40. In some embodiments, the second overlay mark OM2 located on the overlay mark region R1 and the patterned mask layer 53B located on the main region R2 may be formed concurrently by the same process, but not limited thereto. The patterned mask layer 53B and the second overlay mark OM2 may be formed by performing an exposure process with the same mask to the photoresist material 53 and performing a develop process subsequently. In other words, the second overlay mark OM2 and the patterned mask layer 53B may be formed concurrently by the same material and the same process, and the material composition of the second overlay mark OM2 may be identical to the material composition of the patterned mask layer 53B accordingly.

Subsequently, as shown in FIG. 12, FIG. 13, and FIG. 9, a patterning process may be performed to the metal layer 40 on the main region R2 with the patterned mask layer 53B as a mask, and a least a part of the metal layer 40 on the main region R2 may be patterned to be a storage node pad 40P formed on the storage node contact structure 32 and electrically connected with the storage node contact structure 32. In some embodiments, the storage node pad 40P may be formed by a multiple patterning technology, such as a Litho-Etch-Litho-Etch (LELE) method, wherein the cap layer 43 is processes by two exposure processes and two etching processes, and the cap layer 43 patterned twice is then used to pattern the meta layer 40 for forming the storage node pad 40P. The second overlay mark OM2 located on the overlay mark region R1 may be formed by one exposure process of the LELE method described above, such as the second exposure process, but not limited thereto. When the light source of the exposure process described above is a dipole light source for enhancing exposure performance, the depth of field (DOF) will be shallower respectively. Therefore, there will be an obvious height difference between the photoresist material 53 on the metal layer 40 located on the main region R2 and the photoresist material 53 on the overlay mark region R1 when the metal layer 40 on the overlay mark region R1 is completely removed, a defocus issue may occur to the photoresist material 531 on the overlay mark region R1 during the exposure process, and the second overlay mark OM2 cannot be formed successfully. In this embodiment, the metal layer 40 and the cap layer 43 on the overlay mark region R1 may be partially removed only. The influence of the metal layer 40 on the optical measurements performed to the first overlay mark OM1 may be avoided on the one hand. On the other hand, the second overlay mark OM2 may be formed on the metal layer 40 and the cap layer 43 remaining on the overlay mark region R1 for avoiding related defects generated by the height difference cause by the metal layer 40 and the cap layer 43.

To summarize the above descriptions, in the method of forming the overlay mark structure according to the present invention, the metal layer on the overlay mark region may be partially removed only. Therefore, the first overlay mark may not be covered by the metal layer, and the second overlay mark may be formed on the metal layer remaining on the overlay mark region. The influence of the metal layer covering the first overlay mark on the related optical measurements may be avoided by removing the metal layer on the first overlay mark. In addition, related defects generated by the height difference cause by the metal layer may be avoided by forming the second overlay mark on the metal layer located on the overlay mark region, and the manufacturing yield may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an overlay mark structure, comprising:
- forming an insulation layer on a substrate;
- forming a first overlay mark in the insulation layer;
- forming a metal layer on the substrate, wherein the metal layer covers the insulation layer and the first overlay mark;
- removing the metal layer on the first overlay mark, wherein a top surface of the first overlay mark is lower than a top surface of the insulation layer after the step of removing the metal layer on the first overlay mark; and
- forming a second overlay mark on the metal layer.

2. The method of forming the overlay mark structure according to claim 1, wherein a projection pattern of the first overlay mark in a thickness direction of the substrate surrounds at least a part of a projection pattern of the second overlay mark in the thickness direction of the substrate.

3. The method of forming the overlay mark structure according to claim 1, wherein a main region and an overlay mark region are defined on the substrate, and the first overlay mark and the second overlay mark are formed on the overlay mark region.

4. The method of forming the overlay mark structure according to claim 3, further comprising:

forming isolation structures on the main region; and forming a storage node contact structure between two of the isolation structures adjacent to each other, wherein the first overlay mark and the isolation structures are formed concurrently by the same process.

5. The method of forming the overlay mark structure according to claim 4, wherein a material composition of the first overlay mark is identical to a material composition of the isolation structures.

6. The method of forming the overlay mark structure according to claim 5, wherein the first overlay mark comprises an insulation material.

7. The method of forming the overlay mark structure according to claim 4, wherein the metal layer is further formed on the storage node contact structure.

8. The method of forming the overlay mark structure according to claim 7, further comprising:

forming a patterned mask layer on the metal layer on the main region, wherein the patterned mask layer and the second overlay mark are formed concurrently by the same process.

9. The method of forming the overlay mark structure according to claim 8, wherein a material composition of the second overlay mark is identical to a material composition of the patterned mask layer.

10. The method of forming the overlay mark structure according to claim 9, wherein the second overlay mark comprises a photoresist material.

11. The method of forming the overlay mark structure according to claim 8, further comprising:

performing a patterning process to the metal layer on the main region with the patterned mask layer as a mask, wherein a least a part of the metal layer on the main region is patterned to be a storage node pad on the storage node contact structure.

12. The method of forming the overlay mark structure according to claim 1, further comprising:

forming an anti-reflection layer covering the metal layer, the first overlay mark and the insulation layer after the step of removing the metal layer on the first overlay mark and before the step of forming the second overlay mark, wherein the second overlay mark is formed on the anti-reflection layer.

13. The method of forming the overlay mark structure according to claim 1, further comprising:

forming a cap layer on the metal layer before the step of removing the metal layer on the first overlay mark, wherein a part of the cap layer overlaps the first overlay mark; and removing the cap layer above the first overlay mark before the step of forming the second overlay mark.

14. The method of forming the overlay mark structure according to claim 13, wherein a part of the cap layer is located between the second overlay mark and the metal layer in a thickness direction of the substrate.

* * * * *